United States Patent [19]
Foo et al.

[11] Patent Number: 5,124,014
[45] Date of Patent: * Jun. 23, 1992

[54] METHOD OF FORMING OXIDE LAYERS BY BIAS ECR PLASMA DEPOSITION

[75] Inventors: Pang-Dow Foo, Berkeley Heights, N.J.; Ajit S. Manocha, Allentown, Pa.; John F. Miner, Piscataway; Chien-Shing Pai, Bridgewater, both of N.J.

[73] Assignee: AT&T Bell Laboratories, Murray Hill, N.J.

[*] Notice: The portion of the term of this patent subsequent to Jun. 9, 2009 has been disclaimed.

[21] Appl. No.: 684,453

[22] Filed: Apr. 11, 1991

Related U.S. Application Data

[63] Continuation of Ser. No. 485,418, Feb. 27, 1990, abandoned.

[51] Int. Cl.$^5$ .................... C23C 14/34; H01L 21/02
[52] U.S. Cl. .................... 204/192.32; 427/47; 427/99; 427/255.3; 427/228; 427/238; 204/192.37
[58] Field of Search .................. 204/192.34, 192.32, 204/192.37, 298.31, 298.36, 298.37, 298.38; 427/38, 39, 47, 45.1, 99, 255.3; 437/228, 238

[56] References Cited

U.S. PATENT DOCUMENTS

| | | | |
|---|---|---|---|
| 4,732,761 | 3/1988 | Machida et al. | 437/228 |
| 4,784,719 | 11/1988 | Schutz | 427/38 X |
| 4,872,947 | 10/1989 | Wang et al. | 204/298.35 X |
| 4,874,497 | 10/1989 | Matsuoka et al. | 204/298 |
| 4,877,641 | 10/1989 | Dory | 426/38 |
| 4,892,753 | 1/1990 | Wang et al. | 426/294 X |

OTHER PUBLICATIONS

*Dry Process Symposium*, 1990, "Film Characteristics of APCVD Oxides Using Organic Silicon and Ozone", M. Matsuura, H. Kotani, and H. Abe, pp. 29–34.

*Japanese J. Appl. Phys. Lett.* 22, 1983, "Low Temperature Chemical Vapor Deposition Method Utilizing an Electron Cyclotron Resonance Plasma," Seitaro Matsuo and Mikiho Kiuchi, pp. L210–L212.

*Journal Vac. Sci. Technol. B 4* (4), Jul./Aug. 1986, "SiO$_2$ Planarization Technology with Biasing and Electron Cyclotron Resonance Plasma Deposition for Submicron Interconnections", K. Machida and H. Oikawa, pp. 818–821.

*Primary Examiner*—Nam Nguyen
*Attorney, Agent, or Firm*—M. I. Finston; E. E. Packer

[57] ABSTRACT

A method of forming silicon dioxide layers by bias ECR is described. The layers are formed by reacting oxygen with TEOS or TMCTS. High-quality, void-free layerc can be formed over conductor patterns having high-aspect-ratio intermetallic spacings.

7 Claims, 2 Drawing Sheets

METHOD OF FORMING OXIDE LAYERS BY BIAS ECR PLASMA DEPOSITION

This application is a continuation of application Ser. No. 07/485,418, filed on Feb. 27, 1990 now abandoned.

TECHNICAL FIELD

This invention relates to the field of forming dielectric layers for integrated circuits by plasma deposition, and more particularly to the use of electron cyclotron resonance (ECR) plasma deposition systems in VLSI fabrication to planarize submicron interconnections having high aspect ratios.

BACKGROUND OF THE INVENTION

In the manufacture of semiconductor devices, it is often important to deposit a dielectric layer, such as a silicon dioxide or silicon nitride film, for the purpose of isolating metal contacts formed on an underlying substrate. Such isolation generally involves both filling the spaces between contacts, and covering the upper surfaces of the contacts, with dielectric material. Furthermore, it is often desirable for the layer to be so formed that the upper surface of the layer is planar over an extended region, irrespective of whether individual portions of the upper surface overlie metal contacts or the spaces between such contacts. The formation of such a dielectric layer having a planar upper surface is referred to as planarization.

Various processes are available for forming dielectric layers. However, only processes involving relatively low temperatures are useful for planarizing metal contacts. That is, metal contacts are typically made of aluminum. Aluminum contacts are intolerant of processing temperatures greater than about 400° C. because at such temperatures, hillocks tend to form in aluminum films. Thus, for example, spin-on oxide formation is disadvantageous because good quality spin-on oxide films must be baked at about 900° C. In instances where low-temperature baked spin-on oxide is used, a multilayer sandwich structure is required to protect the aluminum and to assure acceptable device performance. However, this approach adds cost and reduces manufacturing throughput.

Plasma deposition processes are of interest in this regard, because they are able to form dielectric layers of, e.g., silicon dioxide or silicon nitride, at relatively low temperatures. In particular, Electron Cyclotron Resonance (ECR) plasma reactors have been found to produce high-quality silicon dioxide and silicon nitride layers without heating the substrate to more than about 150° C.

FIG. 1 illustrates the elements of an ECR plasma reactor as described, for example, in S. Matsuo and M. Kiuchi, "Low Temperature Chemical Vapor Deposition Method Utilizing an Electron Cyclotron Resonance Plasma," *Japanese J. Appl. Phys. Lett.* 22, pp. L210–L212 (1983). Microwave power flows into plasma chamber 10 through rectangular waveguide 20 and fused quartz window 30. Magnet coils 40 arranged around the plasma chamber produce the magnetic field (typically about 875 Gauss) that is required for ECR behavior at the microwave frequency used (which is typically about 2.45 GHz). The plasma chamber and magnets are cooled by water flowing through inlet 50 and outlet 55. Deposition gases are introduced separately through inlet 60 into the plasma chamber and through inlet 65 into reaction chamber 90. The reactor is evacuated through port 80. Below plasma chamber 10, as viewed in FIG. 1, is reaction chamber 90, within which are substrate holder 100 and substrate 110. Substrate 110 has at least one surface substantially facing plasma chamber 10 (i.e., upwards as viewed in FIG. 1). Between chamber 10 and chamber 90 is annular partition 115. Plasma is extracted from chamber 10 into chamber 90 by a divergent magnetic field method. That is, the magnetic field in chamber 90 gradually weakens along the direction from the plasma chamber to the specimen table. Circulating electrons are diffused rapidly toward the substrate by the magnetic field gradient, and as a consequence, an electrostatic field is created which accelerates ions along the plasma stream from the plasma chamber to the wafer. Ions and/or radicals in the plasma stream react with the deposition gas in the reaction chamber to form dielectric material adherent to the surface of the substrate.

Often, especially with regard to VLSI manufacturing, it is desired to planarize submicron interconnections having high aspect ratios, such as are used in VLSI manufacturing. Referring to FIG. 2, by "submicron" is meant that the distance between at least some pairs of neighboring metal contacts 200 is less than one micron. By "aspect ratio" is meant the height of a contact, divided by the spacing between the relevant contacts.

As material 210 is deposited, the upper surface of the deposited layer, tends, at least initially, to reproduce the topography of the underlying wafer. Accordingly, those portions of the upper dielectric surface that overlie contacts are here called "plateaus," and those portions lying between plateaus are here called "wells."

When a well is narrower than its depth, it is difficult to fill it uniformly. That is, the top tends to accumulate deposited material, growing shoulders that may eventually close off before the bottom is filled, leading to the formation of voids in the deposited material. The ability to fill a well uniformly, and thus to avoid the formation of voids, is strongly dependent on the angle of incidence of the ions that react to form the dielectric. The narrower the well, the more significant these problems become. Thus, aspect ratios of 1.0 and greater are regarded as "high." Because in an ECR plasma reactor the ions are vertically, or nearly vertically, incident on the substrate, ECR plasma reactors are particularly useful for processing submicron interconnections having high aspect ratios.

However, even with vertically incident ions in an ECR plasma reactor, the shoulders, i.e., the upper portions of facing sides of wells, may tend to grow together, closing up before the wells are filled. As a consequence, it is difficult to grow high quality planarizing layers even by this means.

When sputtering, e.g., oxygen or argon sputtering, takes place, however, the sputtering rate is angle-dependent. Thus, relatively high sputtering yield is obtained on those planes that lie at or near 45° to the direction of the incident ions. As a consequence, the shoulders of the oxide profile can be eliminated with only a small loss in deposition rate. As a further consequence, voids are eliminated and an upper surface is produced that may have smaller peak-to-valley fluctuations than the underlying substrate, and in which the sides of the hills are sloping rather than abrupt. Eventually, even these hills can be eliminated and a planar upper surface achieved.

An ECR plasma deposition apparatus can be adapted for simultaneous sputter etching of the dielectric layer during deposition by incorporating means for applying an rf bias to the substrate during deposition, as described, for example, in K. Machida and H. Oikawa, "SiO₂ Planarization Technology With Biasing and Electron Cyclotron Resonance Plasma Deposition for Submicron Interconnections," *J. Vac. Sci. Technol. B* 4 (4), pp. 818-821 (1986). Referring back to FIG. 1, the rf bias is generated by rf generator 120, and applied to specimen 110 through transmission line 140. Plasma deposition performed with an apparatus of this kind is referred to as bias ECR plasma deposition.

Thus, for example, Machida et al., U.S. Pat. No. 4,732,761 discusses the formation of silicon dioxide dielectric layers by bias ECR plasma deposition, using apparatus similar to that depicted in FIG. 1. The reactant materials were silane and oxygen. In addition, argon was injected into the reactor.

Although the method of forming a silicon dioxide dielectric layer by reacting silane and oxygen in a bias ECR reactor is useful, it suffers from certain disadvantages. That is, silane is a hazardous material and therefore relatively undesirable as a silicon-containing reactant. Moreover, relatively high microwave and rf power levels are required by this method, typically, about 2.8 kW microwave and about 1 kW rf, in order to achieve planarization and a commercially acceptable deposition rate. Operation at relatively high power levels is undesirable both because a proportionate amount of electricity is consumed and because the lifetime of the apparatus is decreased. Moreover, in order to provide a commercially acceptable deposition rate, e.g., about 5000 Å/minute, this method requires a high-pumping-speed vacuum system, which adds significant capital cost.

SUMMARY OF THE INVENTION

It has been discovered that when a silicon dioxide dielectric layer is formed in a bias ECR reactor, an acceptably high deposition rate can be maintained, with reduced microwave and rf power levels, by substituting TEOS or TMCTS for silane as the silicon-containing reactant gas. That is, when TEOS (tetraethyl orthosilicate) or TMCTS (tetramethylcyclotetrasiloxane) is used in place of silane, the microwave power can be reduced to, typically, about 650 W, and the rf power can be reduced to, typically, about 400 W. Under these conditions, a deposition rate of 5000 Å per minute or more can be achieved. The high quality of layers that can be deposited in this manner is quite unexpected. The sputtering aspect of the process can be carried out using oxygen alone as the source of sputtering ions, or argon as a source of sputtering ions can be injected into the reactor. When argon is used, the rf power levels are still further reduced. In addition to reducing the power levels required, TEOS and TMCTS are less hazardous materials than silane, and therefore handling difficulties are reduced. Moreover, especially when TMCTS is used, the amount of material required to achieve a relatively high deposition rate is reduced, and as a result, the pumping speed required of the vacuum system is reduced.

DETAILED DESCRIPTION

Figure 1:
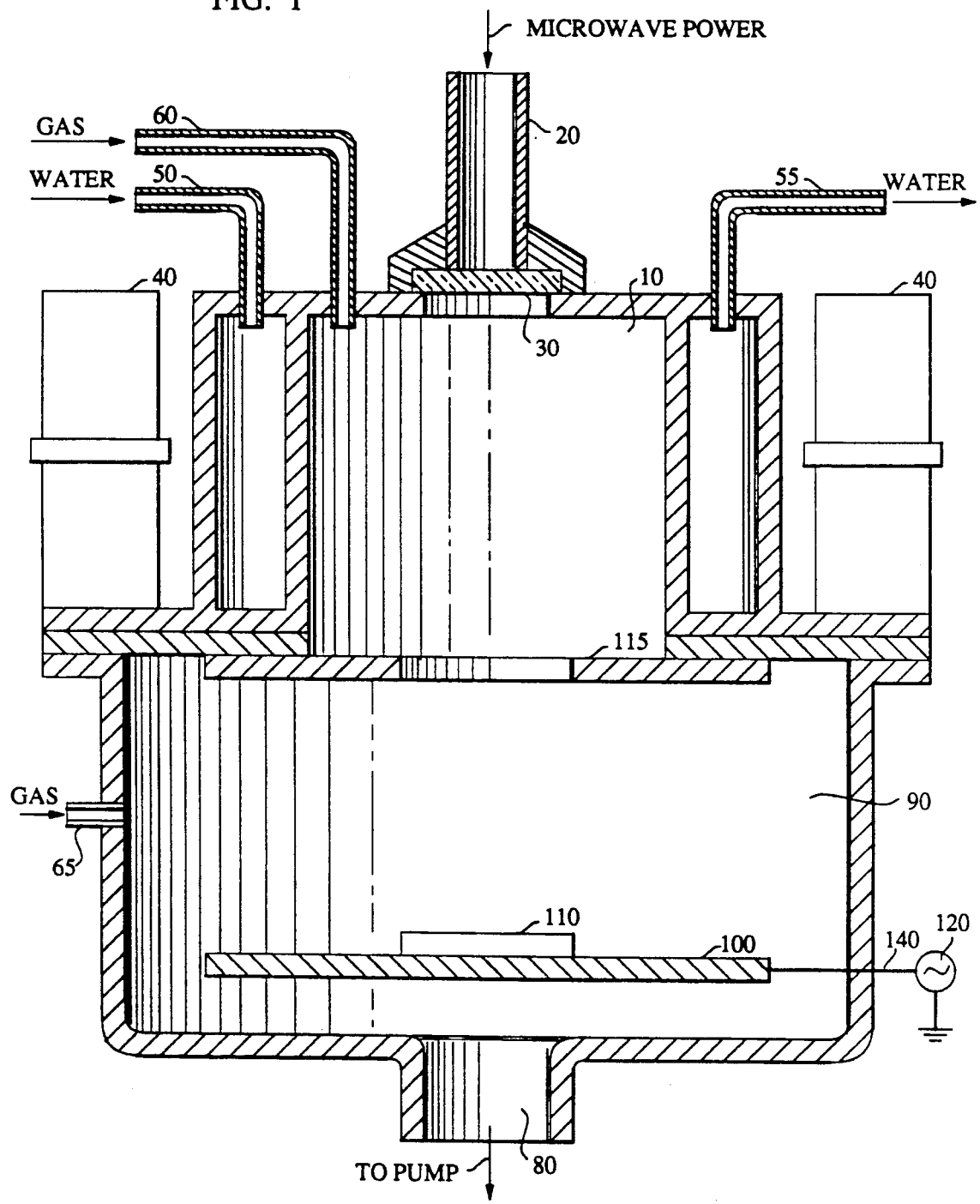
FIG. 1 is a schematic cross-sectional view of a typical bias ECR reactor.

With reference to FIG. 1, a substrate 110 is first prepared, mounted on holder 100, and placed in a bias ECR reactor, according to procedures well-known in the art. The flow of cooling water is initiated, and the reactor is initially evacuated to a pressure of less than 0.1 mtorr. After gas flow is commenced, the reactor is maintained at a pressure below 50 mtorr, as is well-known to be a requirement for bias ECR processing.

A microwave signal is directed into the plasma chamber. Preferably, the microwave frequency should be about 2.45 GHz because this is the standard frequency used commercially. The magnetic field in the plasma chamber is adjusted such that the cyclotron region is within plasma chamber 10, and preferably within the upper portion of the chamber (as viewed in FIG. 1). The microwave power depends upon the deposition rate desired. For deposition rates of 1000-5000 Å/minute, the microwave power is typically about 650 W.

An rf bias is applied to the substrate. Preferably, the rf frequency should be about 13.56 MHz because this is the standard frequency used commercially. After gas is introduced into the reactor, and a plasma is formed, a space charge develops within the plasma, causing a dc bias to appear on the substrate. The rf bias voltage is adjusted to provide adequate bias sputtering. Typically, the rf bias voltage is adjusted to produce a negative dc bias of 100 to 500 volts. At less than 100 V there is insufficient sputtering. At greater than 500 V, there is a danger of radiation damage to the substrate.

Gas is then introduced into the reactor. Oxygen is introduced into the plasma chamber through, for example, inlet 60. After the discharge has been initiated, TEOS or TMCTS is introduced into, e.g., the reaction chamber through, for example, inlet 65. In addition, argon is readily introduced into the plasma chamber through, e.g., inlet 60 together with the flow of oxygen.

If TEOS is used, the oxygen flow rate should be about twice the TEOS flow rate, in order to produce good quality silicon dioxide. If TMCTS is used, the oxygen flow rate should be about three times the TMCTS flow rate. The flow rate of TEOS or TMCTS determines the deposition rate. Thus, for example, when the flow rate of TEOS is increased from 2 sccm to 20 sccm, the oxide deposition rate increases from 104 Å/minute to 1083 Å/minute. Similarly, when the flow rate of TMCTS is increased from 4 sccm to 16 sccm, the oxide deposition rate increases from 800 Å/minute to 3200 Å/minute. The maximum permissible flow rate is limited by the pumping speed of the vacuum system, because it is typically necessary to maintain the pressure in the plasma chamber below 50 mtorr for ECR conditions to exist. At any given flow rate, it is necessary to adjust the microwave power and rf bias voltage (or rf power) in order to obtain the optimum deposition rate. In general, increasing the microwave power increases the deposition rate, and increasing the rf bias decreases the deposition rate.

As noted, the process of forming a silicon dioxide layer has a sputtering aspect in addition to the deposition aspect. Sputtering occurs all the time that oxygen is present in the reaction chamber (provided the rf bias is on and there is material to sputter), and thus, in particular, sputtering takes place simultaneously with deposition. Additionally, in at least some cases it is desirable to perform at least one sputtering step in alternation with deposition (i.e., without reacting additional material to be deposited). This is readily performed by simply shutting off the flow of TEOS or TMCTS. For example, at a negative dc bias of 500 V, wells can be filled with void-free oxide by deposition with sputtering in a single step. By contrast, at a dc bias of only 300 V, at least one sputtering step (without deposition) may be required to achieve similar results.

Figure 2:
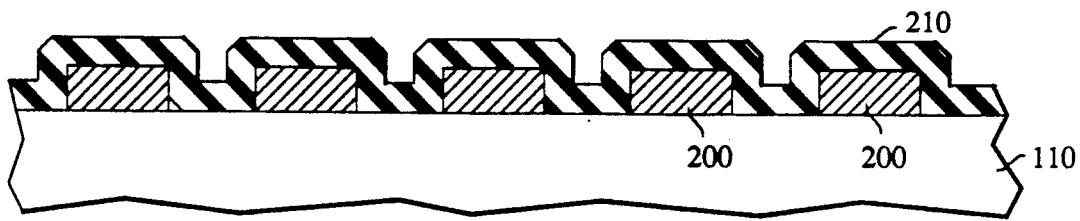
FIGS. 2-4 are schematic cross-sectional views of a substrate, having a high-aspect-ratio metallization pattern formed on it, in various stages of the deposition of a dielectric layer upon it.
Figure 3:
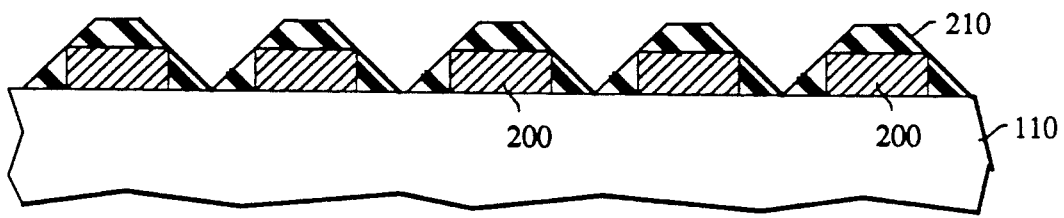
Figure 4:
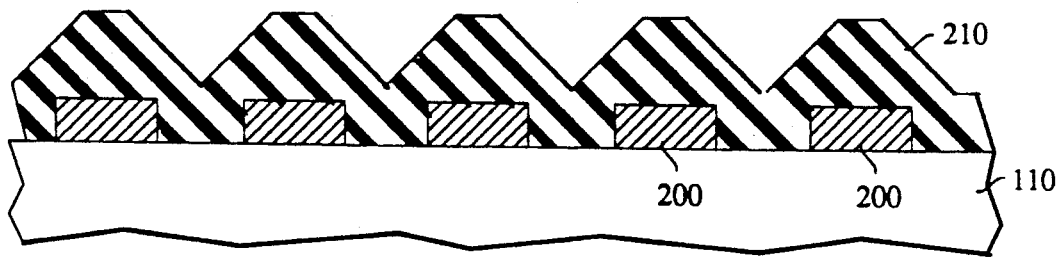

Thus, for example, FIG. 2 depicts, in schematic form, a substrate after deposition at a bias of 300 V. FIG. 3 depicts the same substrate after sputtering by oxygen. FIG. 4 depicts the same substrate after another deposition step following the sputtering step.

As the aspect ratio gets larger, approaching and exceeding unity, it becomes more difficult to form void-free oxide. One approach to this problem is to increase the magnitude of the dc bias. Another approach is to use at least one sputtering step. Although the single-step process is advantageous because it offers relatively high throughput, the magnitudes of dc bias that are acceptable are limited by the possibility of radiation damage above, e.g., 500 V. It is therefore advantageous to use the multiple step process in situations where relatively high aspect ratio is present along with constraints on the dc bias voltage.

Additionally, argon is readily introduced to the reaction chamber to enhance the rate of sputtering. However, for a given pumping rate, adding argon reduces the amount of reactant that can be added to the reactor, and thus reduces the deposition rate. As a consequence, it is desirable to add argon only when the increased rate of sputtering is more important than the consequentially decreased rate of deposition.

An electric heater in the substrate holder is typically used to heat the substrate to about 300° C. prior to exposure in the plasma. The surface temperature rises to about 340° C. during, e.g., a 10-minute exposure. No aluminum hillock formation has been observed during such exposures. Even when the heater is turned off, oxide layers may be obtained at substantially similar deposition rates and of substantially similar quality to those obtained with the heater on.

EXAMPLE

Silicon wafers were prepared having aluminum contacts formed on their upper surfaces. The spacings between the contacts were 0.7 μm wide and had an aspect ratio of 1.4. The wafers were placed in a bias ECR reactor and deposited with silicon dioxide using TMCTS. The microwave frequency was 2.45 GHz, and the rf frequency was 13.56 MHz. The microwave power was 650 W. The oxygen flow rate was 48 sccm (standard cubic centimeters per minute), and the TMCTS flow rate was 16 sccm. No argon was used.

In the particular reactor geometry used, rf power was found to be roughly linear in the dc ("self") bias, rising from about 100 W at a bias of −100 V to about 550 W at a bias of −500 V.

In a three-step process at a dc bias of −300 V, deposition was performed for 2 minutes, followed by sputtering for 4 minutes, followed by deposition for 6 more minutes. In a single-step process at a dc bias of −500 V, a deposition rate of 2150 Å/minute was obtained.

Both processes provided void-free oxide layers having Si-OH optical absorption below the IR detection limit, an etch rate of about 60 Å/minute in 1% HF, compressive stress below $2 \times 10^9$ dynes/cm$^2$, excellent TVS traces, and impurity levels below the Auger detection limit.

We claim:

1. A method of depositing a silicon dioxide planarizing layer on at least a portion of a patterned surface of a semiconductor substrate, the deposition carried out in a plasma reactor that comprises a plasma chamber and a reaction chamber that communicates with the plasma chamber, with the pressure in the plasma chamber being below about 50 mTorr during at least a part of the deposition time, the method comprising:

situating the semiconductor substrate within the reaction chamber such that the patterned surface substantially faces the plasma chamber;

introducing an oxygen-containing first gas into the plasma chamber at a first flow rate;

introducing a silicon-containing second gas into the plasma chamber or the reaction chamber at a second flow rate;

directing microwave power into the plasma chamber such that a plasma is created in the plasma chamber;

exposing the plasma to a magnetic field such that ECR conditions are created, with plasma streaming from the plasma chamber into the reaction chamber and reacting therein with at least the second gas to form the silicon dioxide layer on the patterned surface of the substrate; and during at least a portion of the exposing step, applying an rf bias at an rf power level to the substrate such that the surface of the substrate is sputtered by ions of the first gas; wherein:

a) the patterned surface has an aspect ratio of at least 1.0;
   b) the second gas comprises TMCTS;
   c) during at least a portion of the exposing step, the silicon dioxide layer is deposited at a deposition rate of at least about 1000 Å/minute;
   d) the rf power is at least about 300 W but not more than about 550 W;
   e) the oxygen flow rate is about 3 times the TMCTS flow rate;
   f) during at least a portion of the exposing step, the ratio of the deposition rate to the sum of the first and second flow rates is at least about 34 Å/sccm-minute; and
   g) the first and second flow rates, the rf power, and the microwave power are adjusted such that an adherent, substantially void-free silicon dioxide layer is deposited without introducing ozone into the plasma chamber or the reaction chamber.

2. Method of claim 1, wherein the first gas consists essentially of oxygen and the second gas consists essentially of TMCTS.

3. Method of claim 1, further comprising, during the first gas-introducing step, the step of introducing argon into the plasma chamber, such that the surface of the substrate is sputtered by ions of argon.

4. Method of claim 1, further comprising, after the first and second gas-introducing steps, the step of stopping the flow of the second gas while continuing the flow of the first gas, such that during at least a portion of the time that the first gas flows, the first gas undergoes sputtering at the surface of the substrate without reacting to form silicon dioxide.

5. Method of claim 4, wherein the rf bias is applied at a power level adapted to create on the substrate a dc bias that is negative in sign and has a magnitude of at least about 300 V but not more than about 500 V.

6. Method of claim 1, wherein the rf bias is applied at a power level adapted to create on the substrate a dc bias that is negative in sign and has a magnitude of at least about 300 V but not more than about 500 V.

7. Method of claim 1, wherein the microwave power is at most about 650 Watts.

* * * * *